(12) United States Patent
Yamada

(10) Patent No.: US 6,912,160 B2
(45) Date of Patent: Jun. 28, 2005

(54) NONVOLATILE SEMICONDUCTOR MEMORY DEVICE

(75) Inventor: Shigekazu Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 302 days.

(21) Appl. No.: 10/387,064

(22) Filed: Mar. 11, 2003

(65) Prior Publication Data

US 2004/0179396 A1 Sep. 16, 2004

(51) Int. Cl.⁷ .............................................. G11C 16/06
(52) U.S. Cl. ............................... 365/185.2; 365/185.24
(58) Field of Search .......................... 365/185.2, 185.22, 365/185.24, 185.03

(56) References Cited

U.S. PATENT DOCUMENTS 6,801,457 B2 * 10/2004 Tanzawa et al. ....... 365/185.22

FOREIGN PATENT DOCUMENTS

JP       2001156272 A    6/2001    .......... H01L/27/115

* cited by examiner

*Primary Examiner*—Thong Q. Le
(74) *Attorney, Agent, or Firm*—Sheppard Mullin Richter & Hampton LLP

(57) ABSTRACT

A nonvolatile semiconductor memory device includes a memory cell array which includes memory cells and reference cells, the reference cells including a first reference cell and a second reference cell. A data discriminating control unit generates an average reference level based on a reference level supplied from the first reference cell and a reference level supplied from the second reference cell, and the data discriminating control unit determining whether data is zero or one by comparison of a read-out level of each of the memory cells with the average reference level. A reference cell setting unit performs program verification for each memory cell with respect to a threshold level of the first reference cell to obtain a distribution of threshold levels of the memory cells, and the reference cell setting unit setting a threshold level of the second reference cell based on the distribution of the threshold levels of the memory cells.

8 Claims, 7 Drawing Sheets

NONVOLATILE SEMICONDUCTOR MEMORY DEVICE

BACKGROUND OF THE INVENTION

1. Field of the Invention

The present invention generally relates to a nonvolatile semiconductor memory device, and more particularly to a nonvolatile semiconductor memory device which uses a ferroelectric capacitor as a memory element at the time of read-out operation.

2. Description of the Related Art

In a nonvolatile semiconductor memory device, such as a flash memory, a reference current, read from a reference cell therein, is set to a predetermined threshold level (or a fixed reference level), and at the time of read-out operation, a drain current from a memory cell accessed therein is read out as the data, and the read-out current of the memory cell is compared with the reference current of the reference cell. The discrimination as to whether the data is "1" or "0" is performed depending on whether the read-out current is higher than the reference current or not.

When the number of times of rewriting the memory cell in the nonvolatile semiconductor memory device increases, the charge loss in which the writing charge is lacked will occur, and it is in the tendency for the threshold level of the memory cell in the core memory area to become small. On the other hand, the rewriting operation is not normally performed to the reference cells in the reference cell area, and the fixed reference voltage from the reference cells will remain unchanged. For this reason, when the number of times of rewriting increases, the read-out operation is not properly executed with the fixed threshold voltage of the reference cell, and only an inadequate read-out margin is left for the read-out operation.

There is a reference cell setting technique that is used to secure an adequate read-out margin. In this technique, the two reference cells with respect to the data "1" and "0" are provided in the memory cell array as the reference cells for read-out operation. The average of the reference current values from the two reference cells is obtained. The rewriting operation is performed to the reference cells, similar to the memory cells in the core cell area of the memory cell array. Namely, the reference cell REF-0 and the reference cell REF-1 are respectively provided for the data "0" which corresponds to the cell in the programmed state and the data "1" which corresponds to the cell in the erased state. The average of the reference current values from the two reference cells is obtained by reading the drain current from each of the reference cells REF-0 and REF-1, and it is used as the reference level for the data discrimination.

In the case of the above-described technique, the REF-0 is programmed like the memory cell using the reference cell PrRef for program verification check that is set to a predetermined threshold level. In the program verification check, the reference current from the reference cell PrRef for program verification and the read-out current from the memory cell being written thereto are compared. When the read-out current from the memory cell reaches the threshold level that is higher than the reference current, the rewriting operation is ended.

Therefore, only the lower limit is set up for the threshold level of the reference cell REF-0 programmed in the above manner, and it is uncertain whether the actually set threshold level is appropriate. Similarly, only the upper limit is set up for the threshold level of the reference cell REF-1 programmed in the above manner, and it is uncertain whether the actually set threshold level is appropriate.

Hence, the threshold level of the reference cell has the probability distribution with the spread of the amplitude depending on the writing/erasing characteristics. The distribution of the threshold level of the virtual read-out reference cell which is the average of the reference current values from the two reference cells has significant influence on the read-out margin.

When the threshold level of the virtual read-out reference cell is relatively high, the threshold difference with the data "0" of the memory cell becomes small, and the read-out margin on the side of "0" becomes small.

When the threshold level of the virtual read-out reference cell is relatively low, the threshold difference with the data "1" of the memory cell becomes small, and the read-out margin on the side of "1" becomes small.

Accordingly, variations exist in the threshold level of each reference cell depending on the characteristics of the writing and erasing of the reference cell when the average of the reference currents of the two reference cells is obtained as the reference level, variation will arise also on the reference current which is the average of the reference currents of the two reference cells, and the read-out margin will become unstable.

Meanwhile, a nonvolatile semiconductor memory device such as an ordinary flash memory has the composition in which a plurality of memory cells are arranged in row and columns each memory cell using polysilicon etc. as the floating gate.

On the other hand, a new flash memory which is configured by using the two-bit-per-cell technology has been developed and it is going to be put in practical use. In such memory device, 2 bits of information are stored in the memory cell by trapping the charge in a layer of a silicon nitride film or the like. Hereinafter, each memory cell of such flash memory is called a double bit cell.

Japanese Laid-Open Patent Application No. 2001-156272 discloses a non-volatile semiconductor memory device (flash memory) which implements the two-bit-per-cell technology using a charge-trap layer.

FIG. 1 shows the structure of a double bit cell.

In the flash memory of this type, for example, a charge trap layer is provided between the control gate and the substrate for each memory cell, and the trap layer is comprised of a silicon oxide film, a silicon nitride film and a silicon oxide film which are stacked together in this order. Two bits of information, or the data "1" and the data "0", are stored in the memory cell by trapping the charge in the layer of the silicon nitride film. The threshold level of the memory cell is varied depending on whether the charge is trapped or not, and the read-out current is distinguished between the data "0" and the data "1". In this case, the trap layer, such as silicon nitride, is an insulating film, and the charge is not transferred from the trap layer. Therefore, storing two bits of information per cell is possible by trapping the charge at the ends of the trap layer independently. The two bits of information can be separately read by changing the drain and the source of the cell transistor at the time of read-out operation respectively.

In the flash memory of the above type, when reading one of the two bits per cell, the threshold level is changed according to the state of the bit line which is opposite to one of the two bit lines that is selected and read. That is, the disturbance of the reference level occurs when reading one of the two bits per cell.

FIG. 2 shows the distribution state of the threshold level of the core cells when the read-out operation is performed by a conventional reference cell setting method.

For the sake of convenience, it is assumed in the following description that, in FIG. 2, the bit line A side of each memory cell is in the programmed state and the bit line B of each memory cell is in the erased state. However, in a case where the reverse setting is performed to the memory cell as in FIG. 1, the conventional reference cell setting method can be performed in the same way as in the following.

In the example of FIG. 2, it is assumed that (0, 1) in FIG. 2 indicates the distribution state of the threshold level wherein the bit line A of each memory cell is in the programmed state and the bit line B of each memory cell is in the erased state while the read-out operation is performed for each memory cell. Also it is assumed that (1, 0) in FIG. 2 indicates the distribution state of the threshold level wherein the bit line A of each memory cell is in the erased state and the bit line B of each memory cell is in the programmed stated while the read-out operation is performed for each memory cell. Hereinafter, the former distribution state is called the distribution (0, 1), and the latter distribution state is called the distribution (1, 0).

As is apparent from the state of the distribution (1, 0) of the threshold level indicated by the dotted line in FIG. 2, when the bit line which is opposite to one of the two bit lines that is selected and read is in the programmed state, the threshold level (Vth) deviates or becomes relatively high (or the disturbance of the reference level) due to the influence of the charge trapped in the programmed state. Hence, the difference with the average of the reference current values becomes small.

On the contrary, when the bit line which is opposite to one of the two bit lines that is selected and read is in the erased state, the charge trapped in the erased state does not exist, but the threshold level (Vth) deviates or becomes relatively low. Hence, the difference with the average of the reference current values becomes large.

Accordingly, when the conventional reference cell setting method is performed, it is difficult to secure an adequate read-out margin of the whole memory cell array.

SUMMARY OF THE INVENTION

An object of the present invention is to provide an improved nonvolatile semiconductor memory device in which the above-described problems are eliminated.

Another object of the present invention is to provide a nonvolatile semiconductor memory device which stably offers an adequate read-out margin for the circuit configuration wherein the reference level for the data discrimination is set by the average of the reference current values from the two reference cells of the memory cell array.

The above-described objects of the present invention are achieved by a nonvolatile semiconductor memory device which comprises: a memory cell array including memory cells and reference cells, the reference cells including a first reference cell and a second reference cell; a data discriminating control unit generating an average reference level based on a reference level supplied from the first reference cell and a reference level supplied from the second reference cell, the data discriminating control unit determining read data by comparison of a read-out level from each memory cell of the memory cell array with the average reference level; and a reference cell setting unit performing program verification for each memory cell based on a threshold level of the first reference cell to obtain a distribution of threshold levels of the memory cells, and the reference cell setting unit setting a threshold level of the second reference cell based on the distribution of the threshold levels of the memory cells.

According to the nonvolatile semiconductor memory device of the present invention, the data discriminating control unit carries out program verification of each memory cell based on the first reference cell, and determines the distribution of the threshold level of each memory cell. The data discriminating control unit sets the threshold level of the second reference cell based on the distribution of the threshold level.

Even when the threshold level deviates due to the influence of the charge trapped in the programmed state, the setting of the reference level of the reference cells in which the deviation of the threshold level is taken into consideration is possible. Therefore, the nonvolatile semiconductor memory device of the present invention can stably provide an adequate read-out margin for the reference level of the data discrimination.

BRIEF DESCRIPTION OF THE DRAWINGS

Other objects, features and advantages of the present invention will become apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 4:
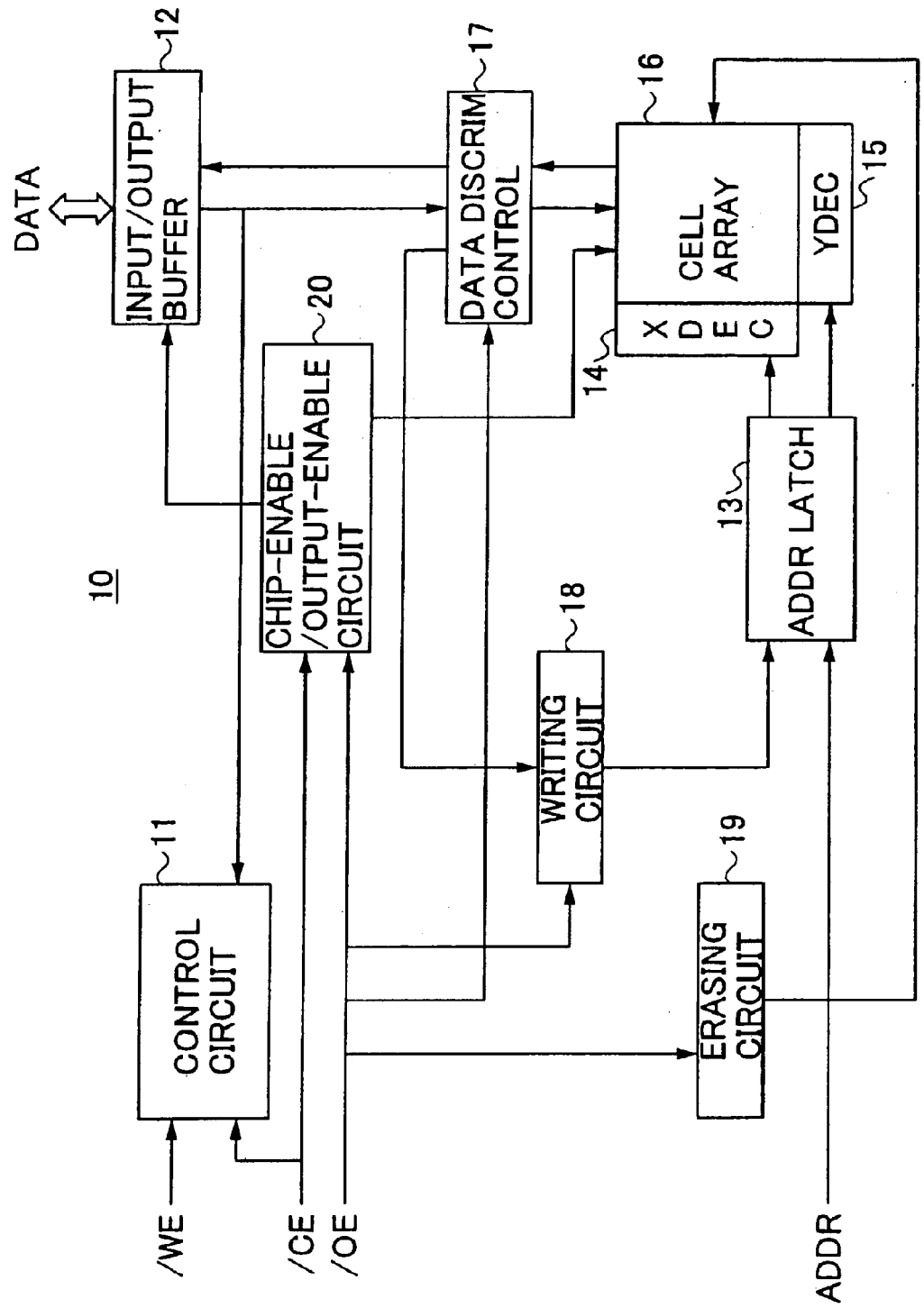
FIG. 4 is a block diagram of a nonvolatile semiconductor memory device to which one preferred embodiment of the present invention is applied.

FIG. 4 shows the nonvolatile semiconductor memory device to which one preferred embodiment of the present invention is applied.

As shown in FIG. 4, the nonvolatile semiconductor memory device 10 in the present embodiment generally includes a control circuit 11, an input/output buffer 12, an address latch 13, an X decoder (XDEC) 14, a Y decoder (YDEC) 15, a memory cell array 16, a data discriminating control circuit 17, a writing circuit 18, an erasing circuit 19, and a chip-enabling/output-enabling circuit 20.

The control circuit 11 receives the externally supplied control signals (/WE, /CE), operates as a state machine based on the received control signals, and controls operation of each of the respective elements of the nonvolatile semiconductor memory device 10.

The input/output buffer 12 receives the externally supplied data, and supplies the received data to the data discriminating control circuit 17.

The address latch 13 receives and latches the externally supplied address signal (ADDR), and supplies the received address signal to the X decoder 14 and the Y decoder 15.

The X decoder 14 decodes the address signal supplied from the address latch 13, and selectively activates the word lines of the memory cell array 16 based on the decoded address signal.

The Y decoder 15 decodes the address signal supplied from the address latch 13, selectively activates the bit lines of the memory cell array 16 based on the decoded address signal, and supplies the read-out data to the data discriminating control circuit 17.

Figure 1:
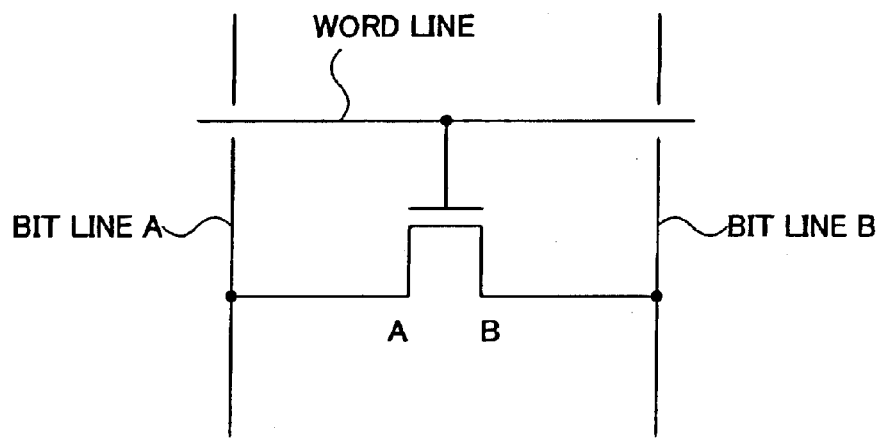
FIG. 1 is a diagram for explaining the structure of a double bit cell.

The memory cell array 16 includes a plurality of memory cells which are arranged in rows and columns in a two-dimensional formation, and each memory cell configured to store 2 bits of information per one cell, or having the two-bit-per-cell composition. Moreover, the memory cell array 16 includes the array of memory cell transistors, the word lines and the bit lines connected to the respective memory cell transistors. Each memory cell of the memory cell array 16 stores data into the related memory cell transistor as shown in FIG. 1.

At the time of read-out operation, the data from the memory cell specified by the activated word line is read out to the corresponding bit line. Moreover, at the time of the programming operation or the erasing operation, the operation of charge pouring to the memory cell or the operation of charge removal from the memory cell is performed by setting the word line and the bit line to a suitable potential according to each operation.

The data discriminating control circuit 17 receives the read-out current from the memory cell, which is specified in the memory cell array 16 by the Y decoder 15 and the X decoder 14, compares the read-out current with the reference current which is the average of the reference current values of the two reference cells. The data discriminating control circuit 17 determines whether the data is "0" or "1" based on the comparison result. The result of the data discrimination is supplied from the data discriminating control circuit 17 to the input/output buffer 12 as the read-out data.

The verification checks, accompanied with the programming operation or the erasing operation, are performed by comparing the read-out current from the memory cell, which is specified among the memory cell array 16 by the Y decoder 15 and the X decoder 14, with the reference current (or the reference level) which is supplied from one of the reference cells for program verification checks or the reference cells for erase verification checks.

In the nonvolatile semiconductor memory device of the present embodiment, the reference cells for the read-out data discrimination are provided within the memory cell array 16. These reference cells are provided as dynamic reference cells which are capable of rewriting operation like the memory core cells. Moreover, the reference cells for program verification checks and the reference cells for erase verification checks are provided outside the memory cell array 16. These reference cells are provided, for example, in the data discriminating control circuit 17, and they are the reference cells having a fixed threshold level.

Based on the writing data supplied, under the control of the control circuit 11, from the input/output buffer 12 to the data discriminating control circuit 17, the writing circuit 18 drives the address latch 13, the X decoder 14, and the Y decoder 15, so that the writing circuit 18 performs data writing operation to the memory cell array 16.

The erasing circuit 19 generates a suitable potential applied to the word line and the bit line at the time of erasing operation, and performs the erasing operation to the memory cell array 16 on the basis of the sector unit.

The chip-enabling/output-enabling circuit 20 receives the chip enable signal /CE and the output enable signal /OE from the external equipment (not shown) as the control signals, and controls activation/deactivation of the input/output buffer 12 and the memory cell array 16 in accordance with the received control signals.

Figure 5:
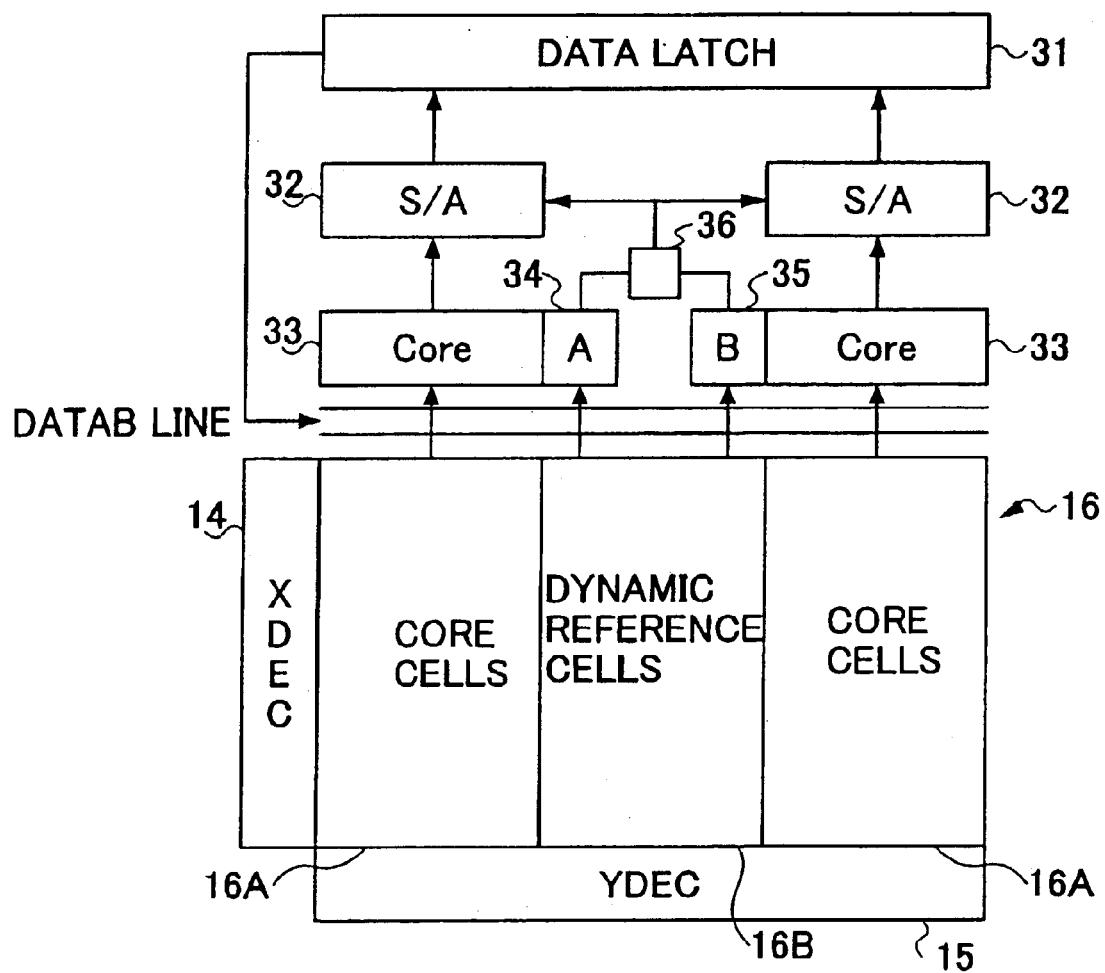
FIG. 5 is a diagram for explaining the circuit configuration of the nonvolatile semiconductor memory device of FIG. 4 which is related to the read-out operation.

FIG. 5 shows the circuit configuration of the nonvolatile semiconductor memory device of FIG. 4 which is related to data read-out operation.

The circuit configuration of FIG. 5 generally includes the data latch 31, the sense amplifiers (S/A) 32, the cascode circuits 33 for the core cells, the cascode circuit 34 for the reference cell A, the cascode circuit 35 for the reference cell B, and the average voltage calculation circuit 36. These components are used to performs the discrimination of the data read from the memory cell array 16. These components of the circuit configuration of FIG. 5 are equivalent to the data discriminating control circuit 17 in the nonvolatile semiconductor memory device of FIG. 4.

The memory cell array 16 includes the core cell area 16A which contains the core cells, and the reference cell area 16B which contains the dynamic reference cells.

The read-out current from one of the core cells of the core cell area 16A is converted into a corresponding voltage signal by the cascode circuit 33. The voltage signal is supplied from the cascode circuit 33 to the sense amplifier 32.

Moreover, the reference current read from the reference cell A of the dynamic reference cell area 16B is converted into a voltage signal by the cascode circuit 34 for the reference cell A. Similarly, the reference current read from the reference cell B of the dynamic reference cell area 16B is converted into a voltage signal by the cascode circuit 35 for the reference cell B.

The average voltage calculation circuit 36 generates the average voltage of the two reference voltages outputted by the cascode circuit 34 and the cascode circuit 35, and supplies the generated average voltage to the sense amplifier 32.

With the sense amplifiers 32, the data discriminating control circuit 17 determines whether the data is "1" or "0" by comparing the read-out voltage level with the average voltage of the two reference voltages. The determination result is supplied to the data latch 31.

Figure 3:
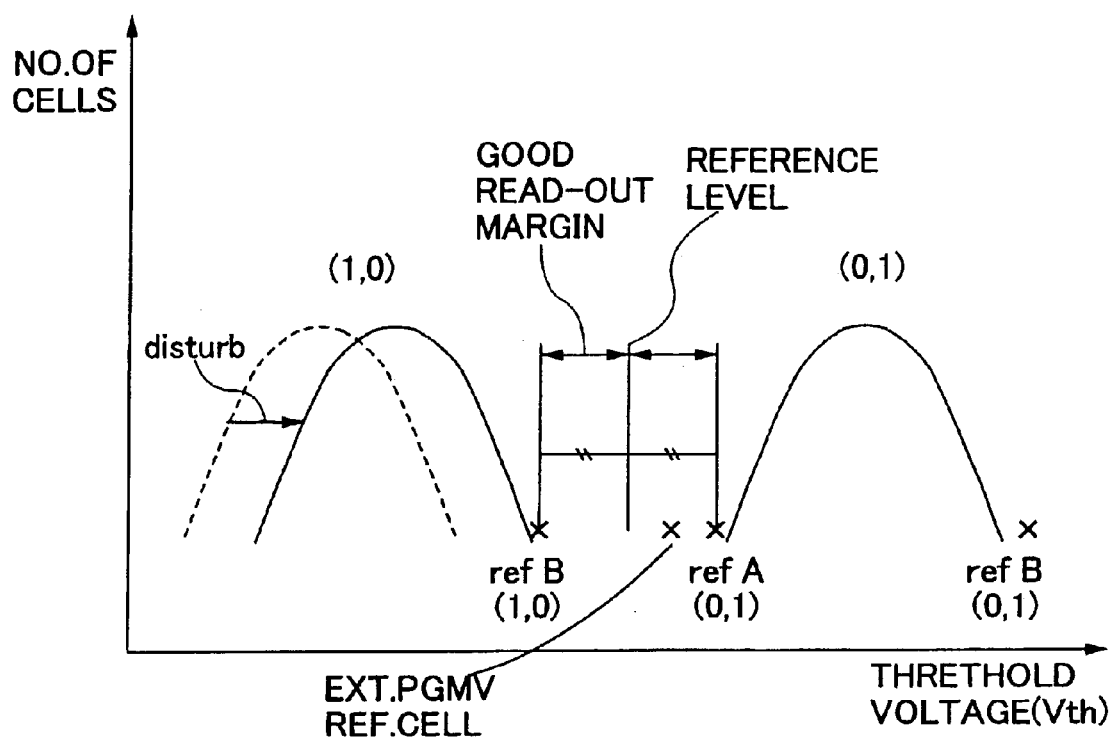
FIG. 3 is a diagram for explaining a reference cell setting method of the present invention.

FIG. 3 is a diagram for explaining the reference cell setting method of the present invention.

Figure 2:
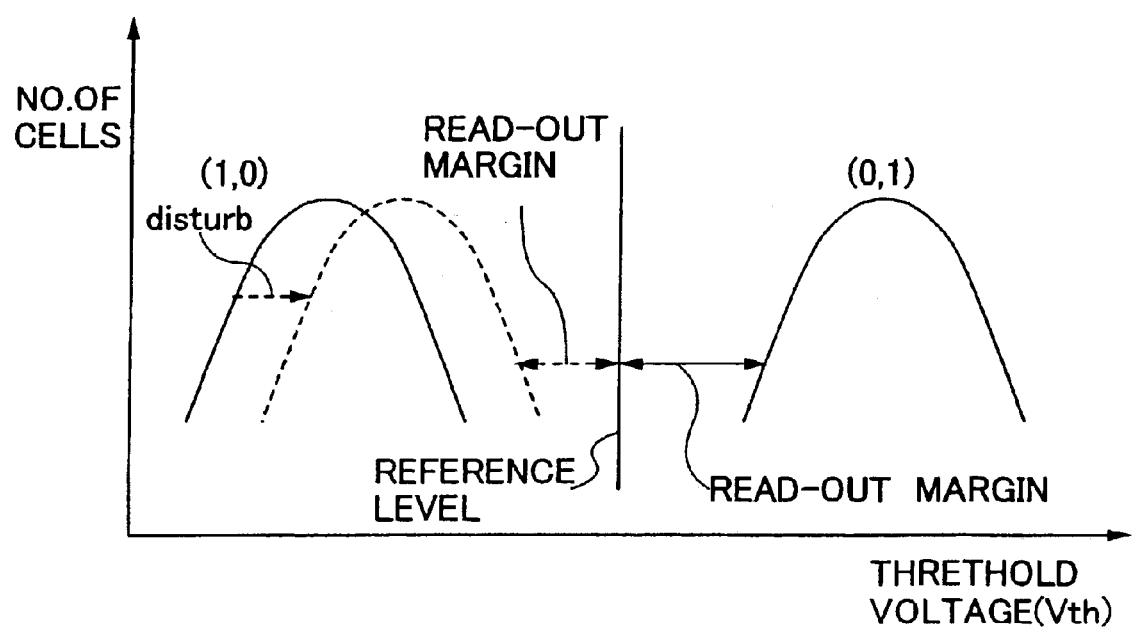
FIG. 2 is a diagram for explaining a conventional reference cell setting method.

Similar to the example of FIG. 2, it is assumed that (0, 1) in FIG. 3 indicates the distribution state of the threshold level wherein the bit line A of each memory cell is in the programmed state and the bit line B of each memory cell is in the erased state while the read-out operation is performed for each memory cell. Also it is assumed that (1, 0) in FIG. 3 indicates the distribution state of the threshold level wherein the bit line A of each memory cell is in the erased state and the bit line B of each memory cell is in the programmed stated while the read-out operation is performed for each memory cell.

For the sake of convenience, it is assumed that the reference cell A (REF_CELL_A) and the reference cell B (REF_CELL_B) are provided in the reference cell area 16B, and they are used for the read-out operation of each memory cell. The reference cell A and the reference cell B are configured similar to the core cells of the core cell area 16A, and they are the dynamic reference cells capable of the rewriting operation.

Moreover, in the data discriminating control circuit 17, the reference cell (PGMV_CELL) for program verification checks is provided to have a fixed threshold level. The reference cell (PGMV_CELL) is provided outside the memory cell array 16. The threshold level of the reference cell (PGMV_CELL) is set, in advance, at a predetermined value.

In the first procedure of the reference cell setting method of the present invention, a threshold level of the reference cell A is set up first. In the example of FIG. 3, the control circuit 11 controls the data discriminating control circuit 17 so that the program verification check of the reference cell A is performed with respect to the fixed threshold level of the reference cell (PGMV_CELL). Hence, the threshold level (REF_A (0, 1)) of the reference cell A is set to a value that is slightly higher than the fixed threshold level.

In the second procedure of the reference cell setting method of the present invention, with respect to the threshold level of the reference cell A, the program verification check is repeatedly performed for core cells of the core cell area 16A whose addresses are inputted by the user, to obtain the distribution (0, 1) of the core cells.

In the example of FIG. 3, the control circuit 11 controls the data discriminating control circuit 17 so that the program verification check is performed for every core cell of the core cell area 16A with respect to the threshold level of the reference cell A, and the distribution (0, 1) of the core cells is thus obtained.

As described above, the program verification check is performed in the second procedure for all the core cells of the core cell area 16A with respect to the threshold level of the reference cell A. Therefore, the threshold level (REF_A (0, 1)) of the reference cell A is set so that it is located at the left-side edge of the distribution (0, 1).

In the third procedure of the reference cell setting method of the present invention, a threshold level of the reference cell B is set up based on the distribution (0, 1) of the core cells that has been obtained in the second procedure.

In the example of FIG. 3, the control circuit 11 controls the data discriminating control circuit 17 so that the program verification check for each core cell of the core cell area 16A with respect to the reference level of the reference cell B is performed based on the distribution (0,1) of the core cells. According to the control of the control circuit 11, the data discriminating control circuit 17 sets the threshold level (REF_B (1, 0)) of the reference cell B to a value that is slightly higher than the maximum of the threshold level in the distribution (1, 0) of the core cells. In the present embodiment, the distribution (1, 0) and the distribution (0, 1) have the same configuration and are symmetrical about the average voltage of the two reference levels provided by the reference cells A and B.

As described above, the program verification check is performed for all the core cells of the core cell area 16A based on the distribution (0, 1) obtained in the second procedure. Therefore, the threshold level (REF_B (1, 0)) of the reference cell B is set so that it is located at the right-side edge of the distribution (1,0).

As shown in FIG. 3, even when the threshold level deviates due to the influence of the charge which is trapped in the programmed state, the setting of the threshold level of the reference cell in which the deviation of the threshold level (or the disturbance of the reference level) is taken into consideration is carried out according to the reference cell setting method of the present embodiment. Therefore, it is possible to stably provide an adequate read-out margin for the reference level of the data discrimination.

Figure 6:
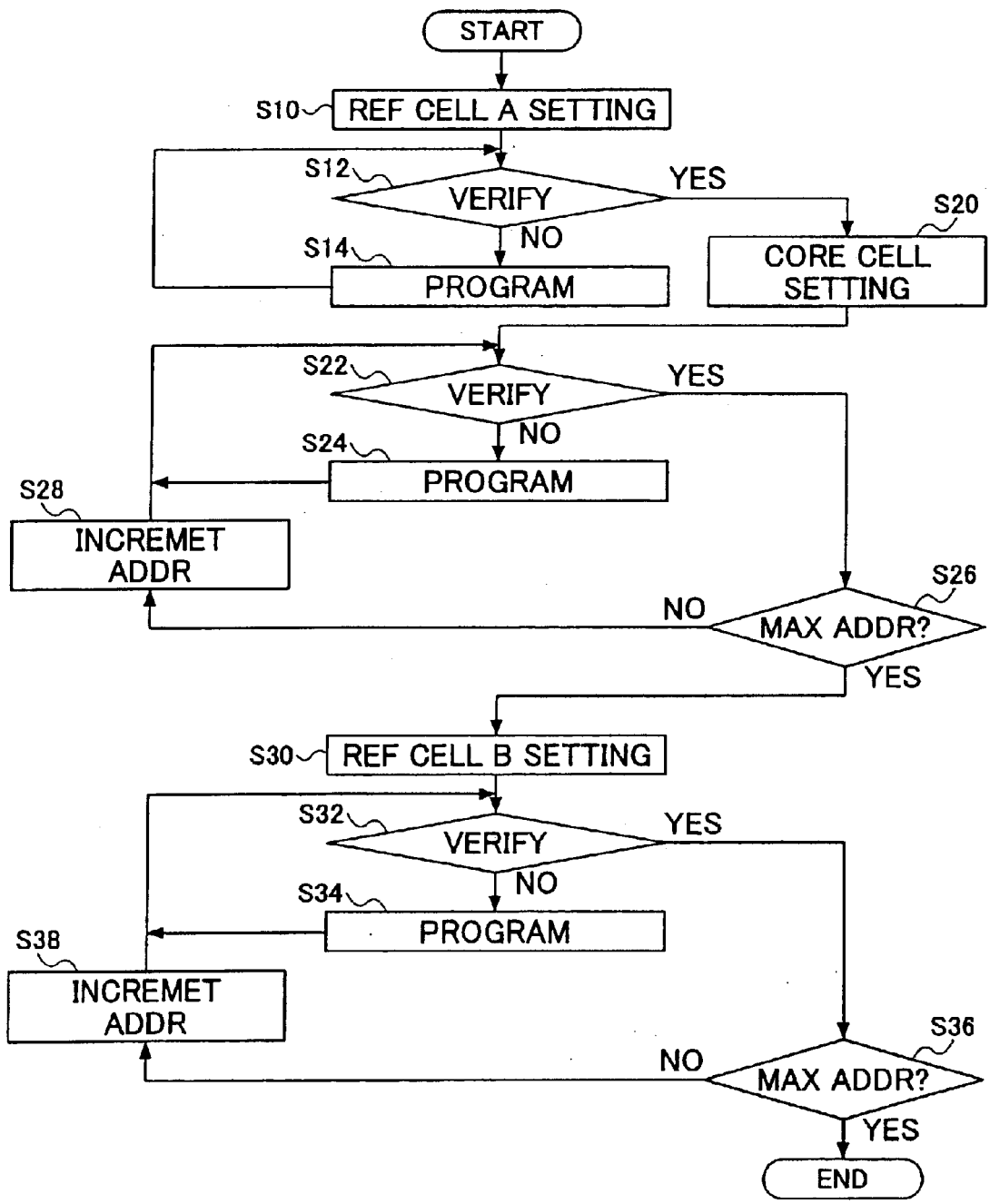
FIG. 6 is a flowchart for explaining the reference cell setting method which is performed by one preferred embodiment of the nonvolatile semiconductor memory device of the present invention.

FIG. 6 is a flowchart for explaining the reference cell setting method which is performed by one preferred embodiment of the nonvolatile semiconductor memory device of the present invention.

As described above, in the nonvolatile semiconductor memory device of the present embodiment, the control circuit 11 controls the data discriminating control circuit 17, and thereby carries out the first procedure, the second procedure and the third procedure of the reference cell setting method of FIG. 6.

As shown in FIG. 6, the control circuit 11 sets up the reference level of the reference cell A in the first procedure (S10–S14). In the first procedure, the control circuit 11 controls the data discriminating control circuit 17 so that the program verification check is performed for the reference cell A based on the fixed threshold level of the reference cell (PGMV_CELL) for program verification checks, and sets the threshold level (REF_A (0, 1)) of the reference cell A to a value that is slightly higher than the fixed threshold level of the reference cell (PGMV_CELL).

At step S10, the control circuit 11 controls the data discriminating control circuit 17, receives the fixed threshold level of the reference cell (PGMV_CELL) for program verification checks, and sets the threshold level of the reference cell A to an initial value. At step S12, the control circuit 11 controls the data discriminating control circuit 17 to perform the verification check, and determines whether the verification condition is satisfied with the initial value of the threshold level or not. In this case, the verification condition of the step S12 is that the value of the threshold level of the reference cell A be higher than the fixed threshold level of the reference cell (PGMV_CELL).

When the result of the step S12 is affirmative (YES, or the verification condition is satisfied), the control of the control circuit 11 is transferred to the next step S20. When the result of the step S12 is negative (NO, or the verification condition is not satisfied), the control circuit 11 controls the data discriminating control circuit 17 to perform the programming operation at step S14 so that the threshold level of the reference cell A is changed to another value. After this, the control of the control circuit 11 is returned to the above step S12.

Next, in the second procedure (S20–S28), with respect to the reference level of the reference cell A, the control circuit 11 performs program verification check for core cells of the core cell area 16A whose addresses are inputted by the user, so that the distribution (0, 1) of the core cells of the core cell area 16A is obtained.

At step S20, the control circuit 11 controls the data discriminating control circuit 17 to receive the threshold level of the reference cell A obtained in the first procedure, and sets the address of the target core cell to a starting address of the core cells. The starting address is a first one of the addresses of the core cells in the core cell area 16A which are already programmed or will be programmed.

At step S22, the control circuit 11 controls the data discriminating control circuit 17 to perform the verification check, and determines whether the verification condition of the threshold level of the target core cell is satisfied with respect to the reference level of the reference cell A or not. In this case, the verification condition of the step S22 is that the threshold level of the target core cell be higher than the reference level of the reference cell A.

When the result of the step S22 is affirmative (YES), the control of the control circuit 11 is transferred to the next step S26. When the result of the step S22 is negative (NO), the control circuit 11 controls the data discriminating control circuit 17 to perform the programming operation at step S24 so that the threshold level of the target core cell is changed to another value. After this, the control of the control circuit 11 is returned to the above step S22.

At step S26, the control circuit 11 controls the data discriminating control circuit 17 to determine whether the address of the target core cell reaches a maximum address of the core cells in the core cell area 16A. The maximum address is a last one of the addresses of the core cells in the core cell area 16A which are already programmed or will be programmed.

When the result of the step S26 is negative (NO), the control of the control circuit 11 is transferred to the next step S28. When the result of the step S26 is affirmative (YES), the control of the control circuit 11 is transferred to the next step S30.

At step S28, the control circuit 11 controls the data discriminating control circuit 17 to increment the address of the target core cell. After this, the control of the control circuit 11 is returned to the above step S22.

In the second procedure, the program verification check is performed for every core cell of the core cell area 16A, and the distribution (0, 1) of the core cells is obtained. Therefore, the threshold level (REF_A (0, 1)) of the reference cell A is set so that it is located at the left-side edge of the distribution (0, 1) of the core cells.

Next, in the third procedure (S30–S38), the control circuit 11 sets a threshold level of the reference cell B based on the distribution (0, 1) of the core cells that is obtained in the second procedure.

At step S30, the control circuit 11 controls the data discriminating control circuit 17 to receive the distribution (0, 1) of the core cells obtained in the second procedure, sets the threshold level of the reference cell B to an initial value, and sets the address of the target core cell to the starting address of the core cells.

At step S32, the control circuit 11 controls the data discriminating control circuit 17 to perform the verification check, and determines whether the verification condition of the threshold level of the target core cell is satisfied with respect to the read-out reference level of the reference cell B or not. In this case, the verification condition of the step S32 is that the read-out level of the reference cell B be higher than the threshold level of the target core cell.

When the result of the step S32 is affirmative (YES), the control of the control circuit 11 is transferred to the next step S36. When the result of the step S32 is negative (NO), the control circuit 11 controls the data discriminating control circuit 17 to perform the programming operation at step S34 so that the threshold level of the reference cell B is changed to another value. After this, the control of the control circuit 11 is returned to the above step S32.

At step S36, the control circuit 11 controls the data discriminating control circuit 17 to determine whether the address of the target core cell reaches the maximum address of the core cells.

When the result of the step S36 is negative (NO), the control of the control circuit 11 is transferred to the next step S38. At step S38, the control circuit 11 controls the data discriminating control circuit 17 to increment the address of the target core cell. After this, the control of the control circuit 11 is returned to the above step S32.

When the result of the step S36 is affirmative (YES), the reference cell setting method of FIG. 6 ends.

In the third procedure, the program verification check between the reference cell B and each memory cell of the core cell area 16A is performed based on the distribution (0, 1) of the core cells. The control circuit 11 controls the data discriminating control circuit 17 to set the threshold level (REF_B (1, 0)) of the reference cell B to a value that is slightly higher than the maximum of the threshold level in the distribution (1, 0) of the core cells.

The program verification check is repeatedly performed for all the core cells of the core cell area 16A based on the distribution (0, 1) obtained in the second procedure. The distribution (1, 0) and the distribution (0, 1) have the same configuration and are symmetrical about the average voltage of the two reference levels provided by the reference cells A and B. Therefore, the threshold level (REF_B (1, 0)) of the reference cell B is set so that it is located at the right-side edge of the distribution (1, 0).

Once the reference cell setting method of FIG. 6 is carried out, the control circuit 11 controls, at the time of read-out operation, the data discriminating control circuit 17 to determine whether the data is "1" or "0" by comparison of the read-out level of the data of each memory cell with the average level of the two threshold levels of the reference cell A and reference cell B outputted from the average voltage calculation circuit 36. The determination result is supplied to the data latch 31.

Accordingly, even when the threshold level in the distribution (1, 0) deviates due to the influence of the charge trapped in the programmed state (or the disturbance of the reference voltage), the setting of the reference level of the reference cells in which the deviation of the threshold level is taken into consideration is possible. The nonvolatile semiconductor memory device of the present embodiment can stably provide an adequate read-out margin for the reference level of the data discrimination.

Figure 7:
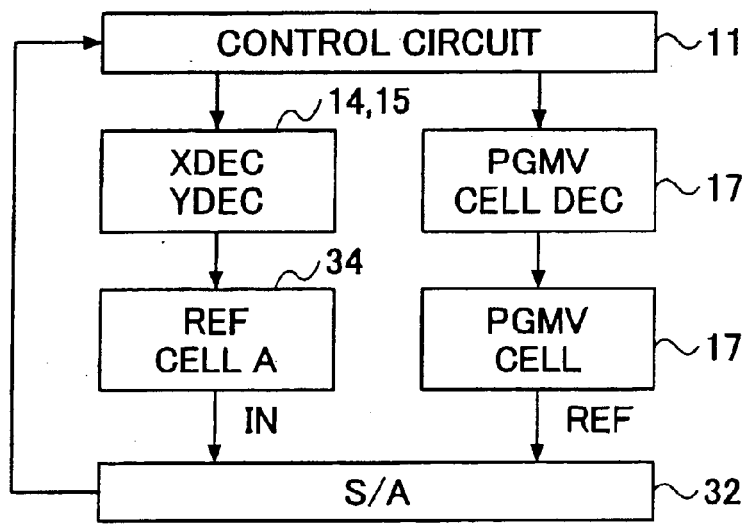
FIG. 7 is a diagram for explaining the control flow when at the time of performing the first procedure of the reference cell setting method of FIG. 6.

FIG. 7 is a diagram for explaining the control flow at the time of performing the first procedure (S10–S14) of the reference cell setting method of FIG. 6.

As shown in FIG. 7, the control circuit 11 outputs the control signal to the data discriminating control circuit 17 so that the reference cell (PGMV_CELL) for program verification checks provided in the data discriminating control circuit 17 is specified. The control circuit 11 receives the fixed reference voltage of the reference cell (PGMV_CELL) as the reference level by using the sense amplifier 32.

Moreover, the control circuit 11 outputs the control signals to the X decoder 14 and the Y decoder 15 so that reference cell A of the reference cell area 16B is specified. The control circuit 11 receives the threshold level of the reference cell A as the input voltage by using the cascode circuit 34 and the sense amplifier 32. In this case, the normal operation of the average voltage calculation circuit 36 is deactivated, and the average voltage calculation circuit 36 acts to merely transfer the voltage signal from the cascode circuit 34 to the sense amplifier 32.

Figure 8:
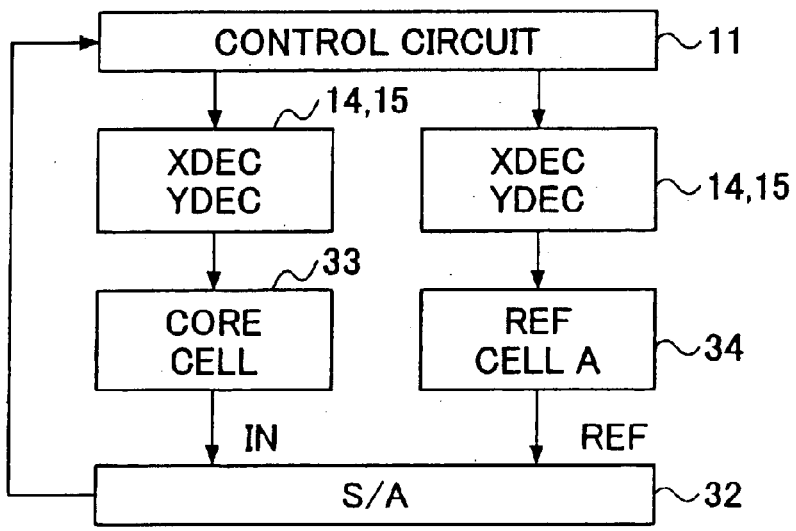
FIG. 8 is a diagram for explaining the control flow at the time of performing the second procedure of the reference cell setting method of FIG. 6.

FIG. 8 is a diagram for explaining the control flow at the time of performing the second procedure (S20–S28) of the reference cell setting method of FIG. 6.

As shown in FIG. 8, the control circuit 11 outputs the control signals to the X decoder 14 and the Y decoder 15 so that the reference cell A of the reference cell area 16B is specified. The control circuit 11 receives the threshold level of the reference cell A as the reference voltage by using the cascode circuit 34 and the sense amplifier 32. In this case, the normal operation of the average voltage calculation circuit 36 is deactivated, and the average voltage calculation circuit 36 acts to merely transfer the voltage signal from the cascode circuit 34 to the sense amplifier 32.

Moreover, the control circuit 11 outputs the control signals to the X decoder 14 and the Y decoder 15 so that one of the core cells of the core cell area 16A is specified. The control circuit 11 receives the threshold level of the target core cell as the input voltage by using the sense amplifier 32 and the cascode circuit 33.

Figure 9:
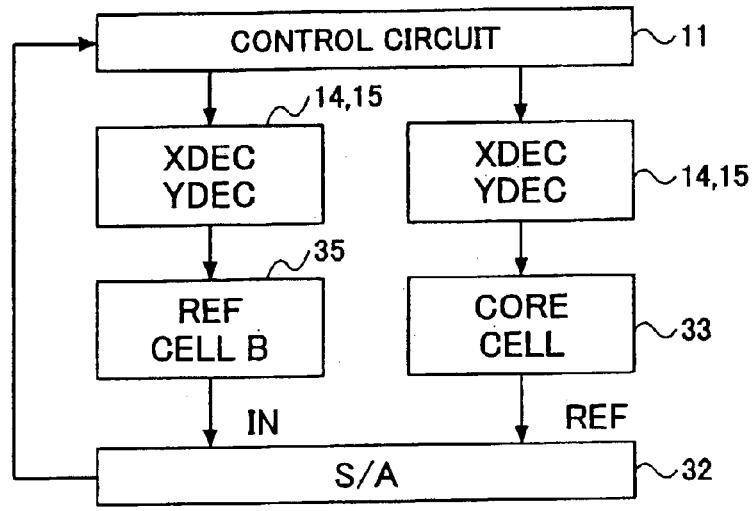
FIG. 9 is a diagram for explaining the control flow at the time of performing the third procedure of the reference cell setting method of FIG. 6.

FIG. 9 is a diagram for explaining the control flow at the time of performing the third procedure (S30–S38) of the reference cell setting method of FIG. 6.

As shown in FIG. 9, the control circuit 11 outputs the control signals to the X decoder 14 and the Y decoder 15 so that one of the core cells of the core cell area 16A is specified. The control circuit 11 receives the read-out level of the target core cell as the reference voltage by using the cascode circuit 33 and the sense amplifier 32.

Moreover, the control circuit 11 outputs the control signals to the X decoder 14 and the Y decoder 15 so that the reference cell B of the reference cell area 16B is specified. The control circuit 11 receives the threshold level of the reference cell B as the input voltage by using the cascode circuit 35 and the sense amplifier 32. In this case, the normal operation of the average voltage calculation circuit 36 is deactivated, and the average voltage calculation circuit 36 acts to merely transfer the voltage signal from the cascode circuit 35 to the sense amplifier 32.

Figure 10:
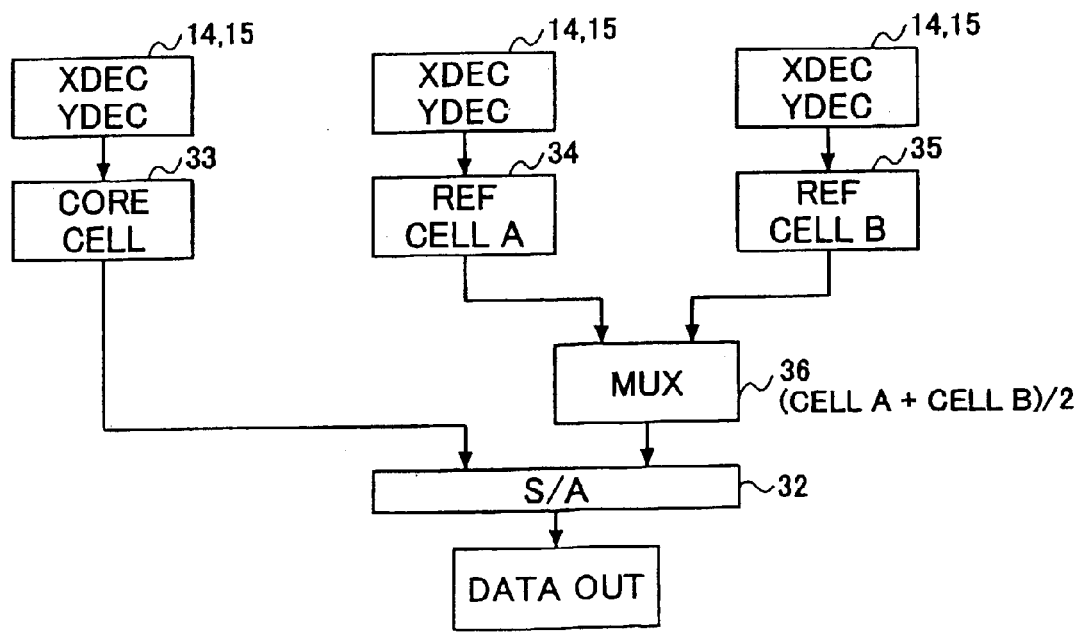
FIG. 10 is a diagram for explaining the read-out operation which is performed by the nonvolatile semiconductor memory device of the present embodiment.

FIG. 10 is a diagram for explaining the read-out operation which is performed by the nonvolatile semiconductor memory device of the present embodiment.

As shown in FIG. 10, at the time of performing the read-out operation, the control circuit 11 outputs the control signals to the X decoder 14 and the Y decoder 15 so that the target core cell of the core cell area 16A is specified, and the threshold level of the target core cell is read out by using the cascode circuit 33 and the sense amplifier 32.

At the same time, the control circuit 11 outputs the control signals to the X decoder 14 and the Y decoder 15 so that the reference cell A and the reference cell B of the reference cell area 16B are specified, and both the threshold levels of the reference cell A and the reference cell B are supplied to the average voltage calculation circuit 36 through the cascode circuit 34 and the cascode circuit 35.

In this case, the normal operation of the average voltage calculation circuit 36 is activated, and the average voltage calculation circuit 36 generates the average voltage of the two reference voltages outputted by the cascode circuit 34 and the cascode circuit 35. The control circuit 11 receives the average voltage as the reference voltage through the average voltage calculation circuit 36 and the sense amplifier 32.

The control unit 11 controls the data discriminating control circuit 17 to determine whether the data is "1" or "0" by comparison of the threshold level of the data of the target core cell with the reference level. The determination result is supplied to the data latch 31.

The present invention is not limited to the above-described embodiment, and variations and modifications may be made without departing from the scope of the present invention.

As for the reference cell setting method of the above-described embodiment, it is the case where one side of the bit lines of each memory cell is selected for the read-out operation and the opposite side of the bit lines is in the programmed state. However, the reference cell setting method of the present invention is applicable to, for example, a case where one side of the bit lines of each memory cell is selected for the read-out operation and the opposite side of the bit lines is in the erased state.

What is claimed is:

1. A nonvolatile semiconductor memory device comprising:

a memory cell array including memory cells and reference cells, the reference cells including a first reference cell and a second reference cell;

a data discriminating control unit generating an average reference level based on a reference level supplied from the first reference cell and a reference level supplied from the second reference cell, the data discriminating control unit determining read data by comparison of a read-out level of each of the memory cells with the average reference level; and a reference cell setting unit performing program verification for each of the memory cells based on a threshold level of the first reference cell to obtain a distribution of threshold levels of the memory cells, and the reference cell setting unit setting a threshold level of the second reference cell based on the distribution of the threshold levels of the memory cells.

2. The nonvolatile semiconductor memory device of claim 1 wherein the reference cell setting unit comprises a first reference cell setting unit which sets the threshold level of the first reference cell based on a fixed threshold level of a third reference cell for program verification.

3. The nonvolatile semiconductor memory device of claim 2 wherein the reference cell setting unit comprises a second reference cell setting unit which obtains a distribution of the threshold levels of the memory cells based on the threshold level of the first reference cell by performing a program verification check of each of the memory cells.

4. The nonvolatile semiconductor memory device of claim 3 wherein the reference cell setting unit comprises a third reference cell setting unit which sets the threshold level of the second reference cell based on the distribution of the threshold levels obtained by the second reference cell setting unit.

5. The nonvolatile semiconductor memory device of claim 1 wherein the data discriminating control unit includes a third reference cell for program verification which has a fixed threshold level.

6. The nonvolatile semiconductor memory device of claim 5 wherein the data discriminating control unit acts to set the threshold level of the first reference cell by using the fixed threshold level of the third reference cell for program verification.

7. The nonvolatile semiconductor memory device of claim 1 wherein each memory cell of the memory cell array is configured to store 2 bits of information by trapping charge in a charge-trapping layer of a silicon nitride film.

8. The nonvolatile semiconductor memory device of claim 1 wherein each memory cell of the memory cell array is configured to store 2 bits of information by trapping charge in a charge-trapping layer of a silicon nitride film, and the data discriminating control unit acts to perform program verification of each memory cell when one side of bit lines of the memory cell is selected for read-out operation and the opposite side of the bit lines is in either a programmed state or an erased state.

* * * * *